(12) United States Patent
Knight

(10) Patent No.: US 7,887,188 B2
(45) Date of Patent: Feb. 15, 2011

(54) SPHERICAL HELIOSTAT

(76) Inventor: Laird Knight, P.O. Box 189 24 Fourth St., Davis, WV (US) 26260

( * ) Notice: Subject to any disclaimer, the term of this patent is extended or adjusted under 35 U.S.C. 154(b) by 596 days.

(21) Appl. No.: 12/016,925

(22) Filed: Jan. 18, 2008

(65) Prior Publication Data

US 2009/0183730 A1 Jul. 23, 2009

(51) Int. Cl.
*G03B 21/00* (2006.01)

(52) U.S. Cl. .............. 353/8; 126/576; 126/689; 250/203.4

(58) Field of Classification Search ......... 126/571, 126/573, 576, 605, 689, 690; 250/203.1–203.4; 353/8
See application file for complete search history.

(56) References Cited

U.S. PATENT DOCUMENTS

| | | | |
|---|---|---|---|
| 3,182,654 A | 5/1965 | Culling | |
| 4,126,123 A | 11/1978 | Hall | |
| 4,171,876 A * | 10/1979 | Wood | 359/853 |
| 4,432,342 A | 2/1984 | Lucas et al. | |
| 4,620,382 A | 11/1986 | Sallis | |
| 4,691,075 A | 9/1987 | Murphy | |
| 4,741,609 A | 5/1988 | Sallis | |
| 4,820,033 A * | 4/1989 | Sick | 359/852 |
| 4,870,949 A | 10/1989 | Butler | |
| D307,460 S | 4/1990 | Bradford et al. | |
| D310,657 S | 9/1990 | Bradford et al. | |
| 5,404,868 A | 4/1995 | Sankrithi | |
| 5,692,946 A * | 12/1997 | Ku | 446/456 |
| 5,893,360 A | 4/1999 | Stoumen et al. | |
| 2006/0033674 A1 | 2/2006 | Essig, Jr. et al. | |

FOREIGN PATENT DOCUMENTS

| WO | 2006044949 A2 | 4/2006 |
|---|---|---|
| WO | 2006044949 A3 | 4/2006 |

* cited by examiner

*Primary Examiner*—Thanh X Luu
*Assistant Examiner*—Francis M Legasse, Jr.
(74) *Attorney, Agent, or Firm*—QuickPatents, Inc.; Kevin Prince

(57) ABSTRACT

A heliostat for the collection of solar energy while resting on a surface is disclosed, comprising a rigid disk having an exposed surface, a back surface, and a circular peripheral edge connecting the exposed surface to the back surface. The peripheral edge includes a plurality of wheels each having a rotational axis substantially tangent to the circular peripheral edge of the disk. Each wheel is driven by an electric motor electrically connected to a power source. A hollow, substantially transparent spherical enclosure contains the rigid disk. Each wheel of the disk frictionally engages an inner surface of the enclosure such that rotation of the any of the wheels changes the orientation of the disk within the enclosure. A control circuit is electrically disposed between the power source and each motor. The control circuit includes a direction setting means for causing the motors to orient the exposed surface substantially facing a commanded direction. A rigid frame is included for supporting the enclosure and disk on the surface.

19 Claims, 3 Drawing Sheets

SPHERICAL HELIOSTAT

CROSS-REFERENCE TO RELATED APPLICATIONS

Not Applicable.

STATEMENT REGARDING FEDERALLY SPONSORED RESEARCH AND DEVELOPMENT

Not Applicable.

FIELD OF THE INVENTION

This invention relates to solar energy collection, and more particularly to an improved heliostat structure.

DISCUSSION OF RELATED ART

Numerous innovations for heliostat devices have been provided in the prior art that will be described. Even though these innovations may be suitable for the specific individual purposes to which they address, they differ from the present invention.

A first example, U.S. Pat. No. 4,620,382, issued on Nov. 4, 1986, to Sallis teaches an apparatus for pneumatically or hydraulically tensioning a membrane, which stretched membrane can support a reflective surface for use as a heliostat in a solar energy collection system. One drawback with this type of heliostat device is that it does not include an enclosure to protect the heliostat device.

A second example, U.S. Pat. No. 4,741,609, issued on May 3, 1988, to Sallis teaches a stretched membrane heliostat having a membrane mounted on a generally circular frame, there being a double-walled portion of the membrane that extends in a circle near the periphery of the membrane to form a bladder that is inflatable to tension the membrane. One drawback with this type of heliostat device is that it does not include an enclosure to protect the heliostat device.

A third example, U.S. Pat. No. 4,870,949, issued on Oct. 3, 1989, to Butler teaches a wind resistant, two axis tracker that is used to direct a solar reflector, heliostat, or dish antenna. An elevation drive ring is supported in a vertical orientation by dolly wheels rotatably attached to a base. The reflector is attached at two points along the circumference of the elevation drive ring. In the preferred embodiment, a reflector having a diameter slightly less than the inside diameter of the elevation drive ring is mounted to the elevation drive ring. A number of support members, such as cables, extend from the elevation drive ring to the periphery of the reflector. Azimuth adjustment is either provided by incorporating a horizontal turntable or drive ring as part of the base, or by pivoting the reflector within the elevation drive ring by adjusting the respective lengths of the support cables extending laterally from the elevation drive ring to the periphery of the reflector. One drawback with this type of heliostat device is that it does not include an enclosure to protect the heliostat device.

A fourth example, U.S. Pat. No. 5,404,868, issued on Apr. 11, 1995, to Sankrithi teaches an apparatus using a balloon supported reflective surface for reflecting light from the Sun. A basic embodiment of such an apparatus is a light weight, low cost heliostat using a balloon supported reflective surface. Another embodiment is a solar power concentration apparatus using multiple heliostats with balloon supported reflective surfaces. Yet another embodiment is a solar electric power apparatus, also using multiple heliostats with balloon supported reflective surfaces. Variant embodiments of these apparatus can be sited on land or water surfaces or in the air or in space. One drawback with this type of heliostat device is that it does not include an enclosure to protect the heliostat device.

A fifth example, U.S. Pat. No. 4,126,123, issued on Nov. 21, 1978 to Hall, teaches a solar energy collector that includes a weightless balloon enclosure. Similarly, a sixth example, U.S. Pat. No. 6,877,507, issued on Apr. 12, 2005 to Braun, teaches an electromagnetic collector having a spherical enclosure. Such devices provide for protection of an electromagnetic collector from weather elements, but necessitate that motors or the like must be included outside of the enclosure to re-orient the electromagnetic collector. As such, motors are necessarily exposed to the weather and elements in such devices.

It is apparent now that numerous innovations for heliostat devices have been provided in the prior art that are adequate for various purposes. Furthermore, even though these innovations may be suitable for the specific individual purposes to which they address, accordingly, they would not be suitable for the purposes of the present invention as heretofore described.

None of the aforementioned prior art heliostat devices teaches a heliostat that utilizes a hollow, substantially transparent spherical enclosure in such a way that the collector and motors that reposition the collector are self-contained within the enclosure, away from the elements and weather. Further, all of the aforementioned prior art devices are relatively expensive to manufacture and transport to their installation location.

Clearly, then, there is a need for an inexpensive to manufacture and transport heliostat device that includes a relatively inexpensive protective enclosure. Such a needed device would provide for simplified operation. The present invention accomplishes these objective.

SUMMARY OF THE INVENTION

An object of the present invention is to provide a heliostat that avoids the disadvantages of the prior art.

Another object of the present invention is to provide a heliostat that is simple and inexpensive to manufacture, transport, and use.

Briefly stated, still yet another object of the present invention is to provide a heliostat for the collection of solar energy while resting on a surface, that comprises a rigid disk having an exposed surface, a back surface, and a circular peripheral edge connecting the exposed surface to the back surface. The peripheral edge includes a plurality of wheels each having a rotational axis substantially tangent to the circular peripheral edge of the disk. Each wheel is driven by an electric motor electrically connected to a power source fixed to the disk. A hollow, substantially transparent spherical enclosure contains the rigid disk. Each wheel of the disk frictionally engages an inner surface of the enclosure such that rotation of the any of the wheels changes the orientation of the disk within the enclosure. A control circuit is electrically disposed between the power source and each motor. The control circuit includes a direction setting means for causing the motors to orient the exposed surface substantially facing a commanded direction. A rigid frame is for supporting the enclosure and disk on the surface.

The novel features which are considered characteristic of the present invention are set forth in the appended claims. The invention itself, however, both as to its construction and its method of operation, together with additional objects and advantages thereof, will be best understood from the following description of the specific embodiments when used and understood in connection with the accompanying drawing.

DESCRIPTION OF THE DRAWINGS

The Figures of the drawings are briefly described as follows.

DETAILED DESCRIPTION OF THE PREFERRED EMBODIMENT

Figure 1:
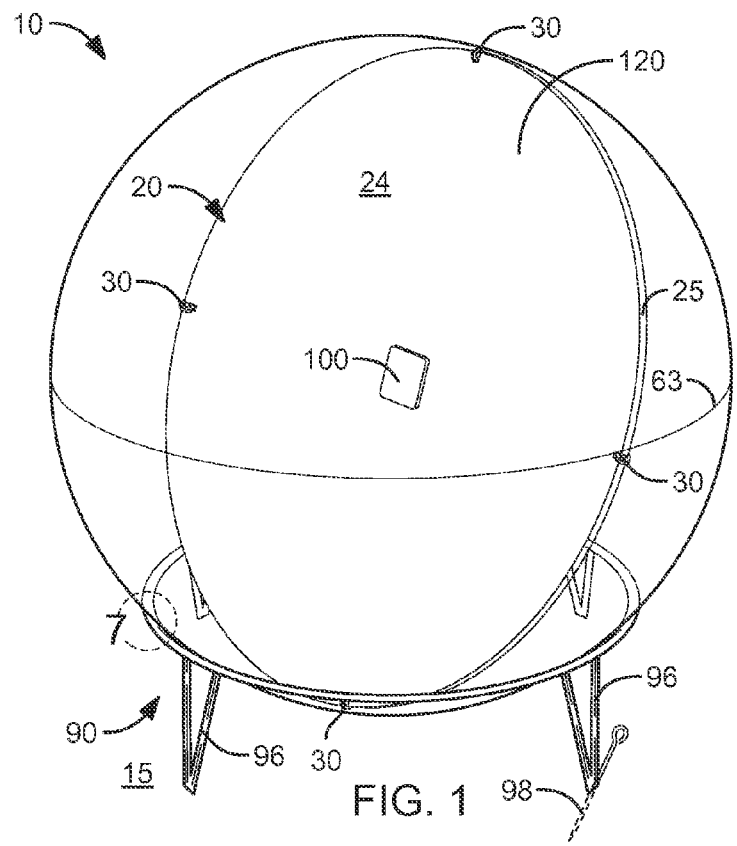
FIG. 1 is a front perspective view of an embodiment of the present invention.
Figure 2:
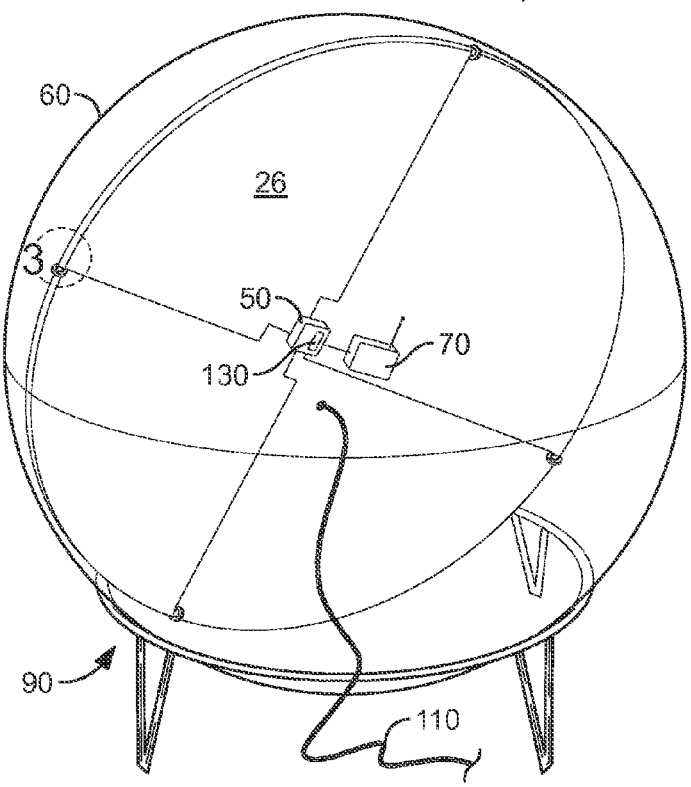
FIG. 2 is a rear perspective view of the present invention.

Referring now to the figures, in which like numerals indicate like parts, and particularly to FIGS. 1 through 8, the present invention will be discussed with reference thereto. A heliostat 10 for the collection of solar energy while resting on a surface 15, is provided. The heliostat 10 comprises a rigid disk 20 having an exposed surface 24, a back surface 26 and a circular peripheral edge 25 connecting the exposed surface 24 to the back surface 26. The peripheral edge 25 includes a plurality of wheels 30, preferably four in number, each having a rotational axis 35 substantially tangent to the circular peripheral edge 25 of the disk 20. At least two such wheels 30 are driven by an electric motor 40 electrically connected to a power source 50, preferably a battery 130 fixed to the disk 20.

A hollow, substantially transparent spherical enclosure 60 contains the rigid disk 20. Each wheel 30 of the disk 20 frictionally engages an inner surface 64 of the enclosure 60 such that rotation of the any of the wheels 30 changes the orientation of the disk 20 within the enclosures 60. A control circuit 70 is electrically disposed between the power source 50 and each motor 40. The control circuit 70 includes a direction setting means 80 for causing the motors 40 to orient the exposed surface 24 substantially facing a commanded direction $D_c$. A rigid frame 90 is included for supporting the enclosure 60 and disk 20 on the surface 15.

The exposed surface 24 of the disk 20 is, in one embodiment, substantially flat. The exposed surface 24, in such an embodiment, further includes a plurality of photovoltaic cells 100 electrically connected to at least one power cable 110 traversing the spherical enclosure 60. The exposed surface 24 may alternately be concave, and in such a case includes a reflective coating 120. As such, the surface 24 may focus sunlight or other light onto a desired object or collector.

Figure 3:
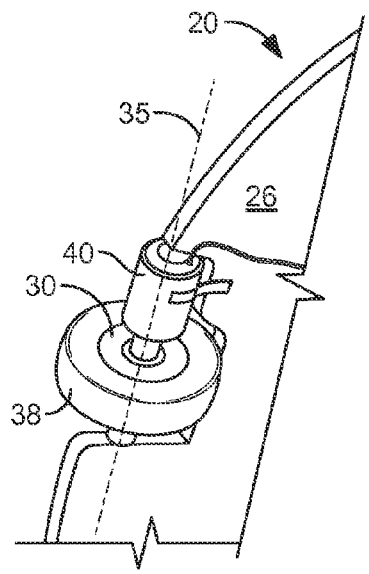
FIG. 3 is an enlarged perspective view of the area indicated by arrow 3 in FIG. 2.
Figure 4:
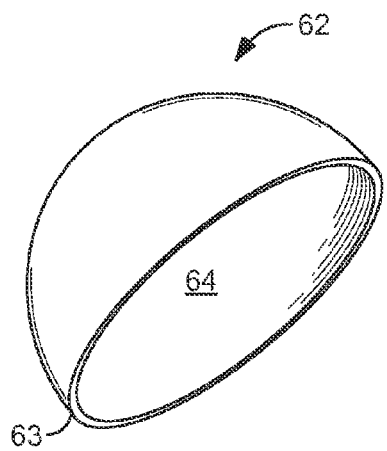
FIG. 4 is a perspective view showing one hemisphere of a rigid enclosure.
Figure 5:
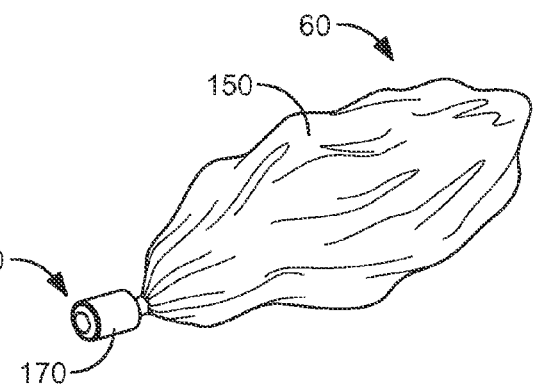
FIG. 5 is a perspective view showing an air pump inflating a flexible enclosure.
Figure 6:
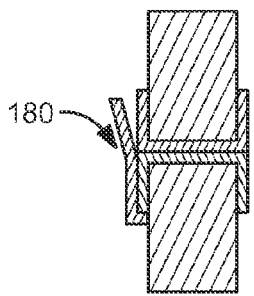
FIG. 6 is an enlarged cross sectional view showing a sealing means holding the two hemisphere together.
Figure 7:
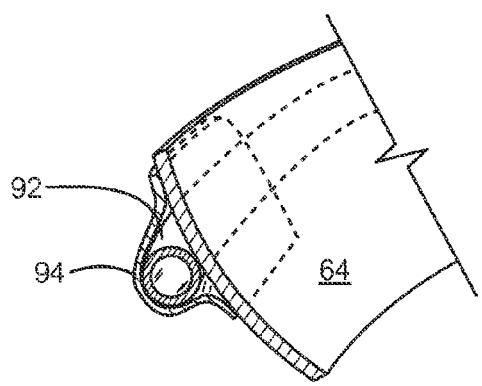
FIG. 7 is an enlarged cross sectional perspective view of the area indicated by arrow 7 in FIG. 1.

Each of the wheels 30 may include a high-friction outer surface 38 for making frictionally immobile contact with the inner surface 64 of the enclosure 60 (FIG. 3). The power source 50 can be the battery 130, or a power source external to the heliostat 10 such as at least one power cable 110 traversing the spherical enclosure 60. In the embodiment having the battery 130, the battery 130 may be charged by at least one photovoltaic cell 100 fixed to the preferably exposed surface 24. The power source 50 may also be the plurality of photovoltaic cells 100 directly.

The enclosure 60 may be comprised of a substantially rigid transparent material 140 (FIG. 4), such as acrylic, other plastic, or the like. The spherical enclosure 60 may be fabricated as two hemispheres 62 selectively fixed together at an equator 63 by a sealing means 180 (FIG. 6), such as a snap fastener as shown or other sealing means 180 as is known in the art. Alternately, or in addition, a re-sealable access flap (not shown) may be included in the enclosure 60 to provide easy access to components within the enclosure 60. Such an access flap may include an air-tight seal (not shown), for example, or a zipper seal (not shown) in non-inflatable enclosures 60.

Alternately, the enclosure 60 may be comprised of a flexible substantially air-impervious material 150 such that the enclosure 60 may be inflated, and further includes an inflating means 160. The inflating means 160 is preferably an air pump 170 electrically connected to the power source 50 and adapted to pump air into the enclosure 60 from outside thereof (FIG. 5), or other air inflation means as is known in the art.

Figure 8:
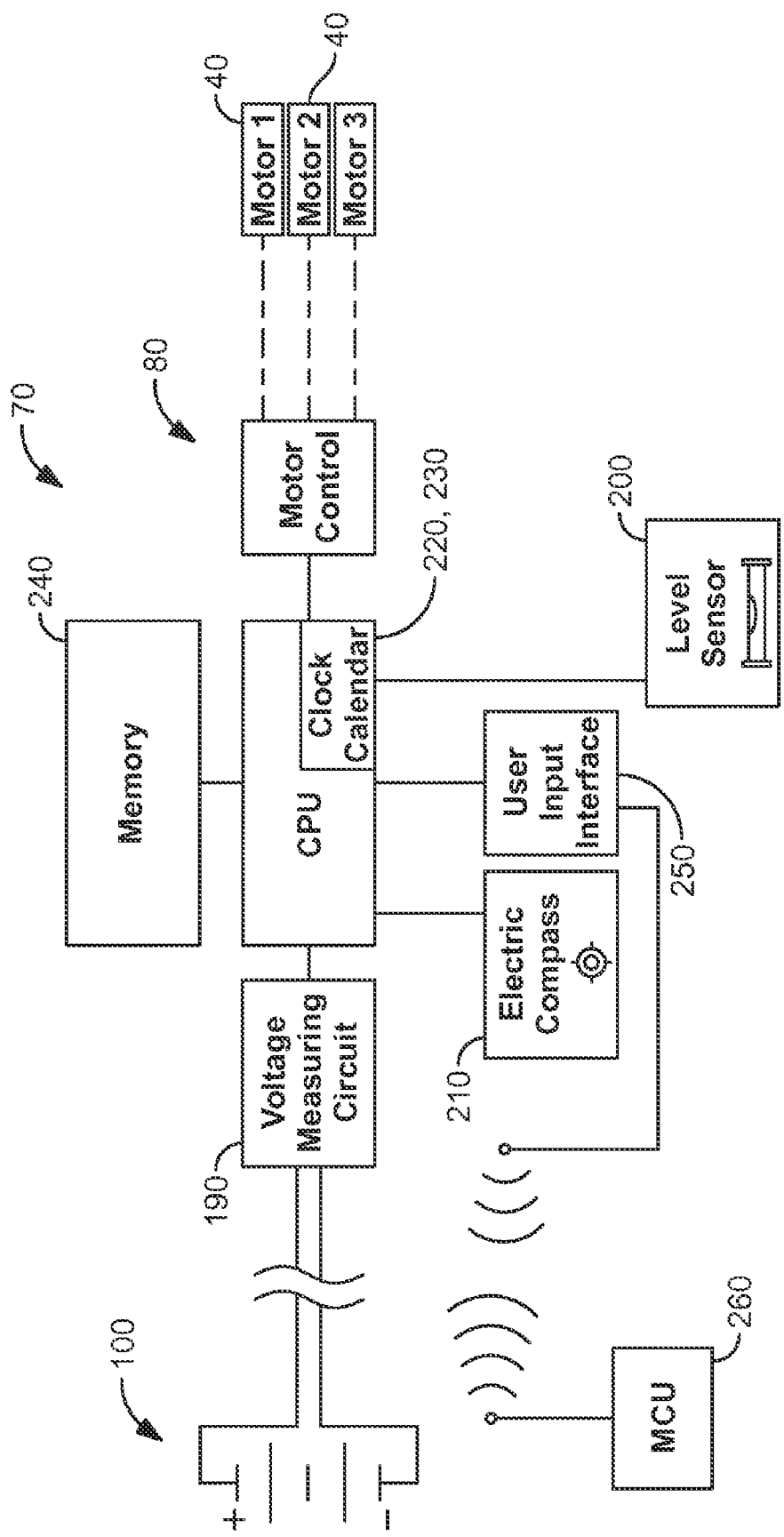
FIG. 8 is a block diagram showing the various electronic components of the present invention.

The direction setting means 80 of the control circuit 70 includes a voltage measuring means 190, whereby the control circuit 70 periodically varies the orientation of the exposed surface 24 to find the orientation resulting in the maximum output voltage of the plurality of photovoltaic cells 100. The direction setting means 80 of the control circuit 70 may alternately include a level sensing means 200, a compass 210, a clock means 220, a calendar means 230, and a preset location memory 240. In such an embodiment, the control circuit 70 calculates the position of the sun relative to the location of the heliostat 10 on earth, the time and date, the direction generally orthogonal to the exposed surface 24 of the disk 20, and an inclination angle of the disk 20 as measured by the level sensing means 200, in order to set the commanded direction $D_c$ of the exposed surface 24 of the disk 20 relative to the position of the sun. The control circuit 70 may also include a wireless transceiver 250 for receiving the commander direction $D_c$ from a master control circuit 260 (FIG. 8). In one embodiment of the invention, the control circuit 70 may traverse the enclosure 60. That is, elements of the control circuit 70, such as the user input interface 250, for example, may be located outside of the enclosure 60, such at when the input interface 250 is a wireless input device (not shown), for example.

The rigid frame 90 includes a supporting ring 92 into which the spherical enclosure 60 sits stationary by gravity and friction. The enclosure 60 may further include a plurality of retaining loops 94 fixed around the supporting ring 92 of the rigid frame 90 (FIG. 7) to keep the enclosure 60 and frame 90 mutually fixed together. The rigid frame 90 includes a plurality of legs 96 for supporting the ring 94 and enclosure 60 above the surface 15. A plurality of stakes 98, may be provided, each for fixing one leg 96 immovably to the surface 15.

The hollow, substantially transparent spherical enclosure 60 is preferably a sealed, unitary structural. As such, the disk 20 of the heliostat 10 within the enclosure 60 is protected against wind, rain, and other weather elements. The heliostat 10 can be incorporated in a componentized power tower system that can be mass produced and rapidly deployed anywhere in the world on a massive scale. Alternately, for smaller scale installations, a combined heat and electric solar collector can be used to receive the reflected solar energy from the plurality of heliostats 10, a micro-steam turbine or concentrated solar photovoltaic power (not shown) being used to produce power.

The exposed surface 24 with the reflective coating 120 on the disk 20 can be appropriately manufactured to produce various focal lengths using a parabolic shape. It can for example, also work as a heliotrope for a sterling engine, for advanced solar cells that can withstand solar concentrations, for a radio or other telescope, or the like.

It will be understood that each of the elements described above, or two or more together, may also find a useful application in other types of constructions differing from the type described above. While the invention has been illustrated and described as embodiments of a heliostat, accordingly it is not limited to the details shown, since it will be understood that various omissions, modifications, substitutions and changes in the form and details of the device illustrated and its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute characteristics of the generic or specific aspects of this invention.

What is claimed is:

1. A heliostat for the collection of electromagnetic energy while resting on a surface, comprising:
   a rigid disk having an exposed surface, a back surface, and a circular peripheral edge connecting the exposed surface to the back surface, the peripheral edge including a plurality of wheels each having a rotational axis substantially tangent to the circular peripheral edge of the disk, at least two of such wheels driven by an electric motor electrically connected to a power source fixed to the disk;
   a hollow, substantially transparent spherical enclosure containing the rigid disk, each wheel of the disk frictionally engaging an inner surface of the enclosure such that rotation of the any of the wheels changes the orientation of the disk within the enclosure;
   a control circuit electrically disposed between the power source and each motor, the control circuit including a direction setting means for causing the motors to orient the exposed surface towards a commanded direction; and
   a rigid frame for supporting the enclosure and disk on the surface.

2. The heliostat of claim 1 wherein the exposed surface of the disk is substantially flat.

3. The heliostat of claim 2 wherein the exposed surface further includes a plurality of photovoltaic cells electrically connected to at least one power cable traversing the spherical enclosure.

4. The heliostat of claim 1 wherein the exposed surface is concave and includes a reflective coating.

5. The heliostat of claim 1 wherein each of the wheels includes a high-friction outer surface for making frictionally immobile contact with the inner surface of the enclosure.

6. The heliostat of claim 1 wherein the power source is a battery, the battery charged by at least one photovoltaic cell fixed to the exposed surface.

7. The heliostat of claim 3 wherein the power source is the plurality of photovoltaic cells.

8. The heliostat of claim 1 wherein the enclosure is comprised of a substantially rigid transparent material.

9. The heliostat of claim 1 wherein the enclosure is comprised of a flexible substantially air-impervious material such that the enclosure may be inflated, and further includes an inflating means.

10. The heliostat of claim 9 wherein the inflating means is an air pump electrically connected to the power source and adapted to pump air into the enclosure from outside thereof.

11. The heliostat of claim 8 wherein the spherical enclosure is two hemispheres selectively fixed together at an equator by a sealing means.

12. The heliostat of claim 3 wherein the direction setting means of the control circuit includes a voltage measuring means, whereby the control circuit periodically varies the orientation of the exposed surface to find the orientation resulting in the maximum output voltage of the plurality of photovoltaic cells.

13. The heliostat of claim 1 wherein the direction setting means of the control circuit includes a level sensing means, a compass, a clock means, a calendar means, and a preset location memory, whereby the control circuit calculates the position of the sun relative to the location of the heliostat on earth, the time and date, the direction generally orthogonal to the exposed surface of the disk, and an inclination angle of the disk as measured by the level sensing means, in order to set the commanded direction of the exposed surface of the disk relative to the position of the sun.

14. The heliostat of claim 1 wherein the control circuit includes a wireless transceiver for receiving the commanded direction from a master control circuit.

15. The heliostat of claim 1 wherein the rigid frame includes a supporting ring into which the spherical enclosure sits stationary by gravity and friction.

16. The heliostat of claim 15 the rigid frame includes a plurality of legs for supporting the ring and enclosure above the surface.

17. The heliostat of claim 16 further including a plurality of stakes, each for fixing one leg immovably to the surface.

18. The heliostat of claim 1 wherein the power source is at least one power cable traversing the spherical enclosure.

19. The heliostat of claim 1 wherein the control circuit traverses the spherical enclosure.

* * * * *